(12) United States Patent
Takeuchi et al.

(10) Patent No.: US 7,915,792 B2
(45) Date of Patent: Mar. 29, 2011

(54) ELASTOMER ACTUATOR

(75) Inventors: Hiromitsu Takeuchi, Aichi-ken (JP); Toru Kobayashi, Tokyo (JP); Junko Suda, Tokyo (JP); Christian Ruslim, Tokyo (JP); Changming Zhao, Tokyo (JP)

(73) Assignee: Toyoda Gosei Co., Ltd., Aichi-pref. (JP)

( * ) Notice: Subject to any disclaimer, the term of this patent is extended or adjusted under 35 U.S.C. 154(b) by 79 days.

(21) Appl. No.: 12/292,155

(22) Filed: Nov. 12, 2008

(65) Prior Publication Data

US 2009/0127979 A1      May 21, 2009

(30) Foreign Application Priority Data

Nov. 15, 2007   (JP) .................................. 2007-296692

(51) Int. Cl.
  *H01L 41/04*   (2006.01)
  *H01L 41/08*   (2006.01)
(52) U.S. Cl. .......................... 310/369; 310/328; 310/800
(58) Field of Classification Search .................. 310/369, 310/328, 800
  See application file for complete search history.

(56) References Cited

U.S. PATENT DOCUMENTS

| 7,038,357 B2* | 5/2006 | Goldenberg et al. ......... 310/328 |
| 7,233,097 B2* | 6/2007 | Rosenthal et al. ............ 310/328 |
| 7,400,080 B2* | 7/2008 | Benslimand et al. ......... 310/369 |
| 7,518,284 B2* | 4/2009 | Benslimane et al. ......... 310/800 |
| 7,548,015 B2* | 6/2009 | Benslimane et al. ......... 310/367 |
| 7,732,999 B2* | 6/2010 | Clausen et al. ............... 310/369 |
| 2003/0006669 A1* | 1/2003 | Pei et al. ........................ 310/309 |
| 2007/0205395 A1* | 9/2007 | Nakajima et al. ........ 252/299.01 |

FOREIGN PATENT DOCUMENTS

WO   WO 98/35529   8/1998

OTHER PUBLICATIONS

Jones, R.W. et al., Dielectric Elastomers and Compliant Metal Electrode Technology, IEEE 2010 pp. 368-373.*

* cited by examiner

*Primary Examiner* — J. SanMartin
(74) *Attorney, Agent, or Firm* — Posz Law Group, PLC

(57) ABSTRACT

An actuator includes a spirally rolled cylindrical sheet body. The sheet body is formed by attaching an electrode on each side of a dielectric elastomer layer. When a voltage is applied to the electrodes, the sheet body is contracted along the direction of its thickness, and expanded in directions perpendicular to its thickness. The actuator is actuated by applying a voltage to the electrodes and stopping the voltage application, so that the cylindrical sheet body is extended and contracted along the direction of the axis. The material forming the dielectric elastomer layer has a low strain region, where the value of a strain based on a stress acting on the dielectric elastomer layer varies from zero to a value that is greater than and close to zero, and a high strain region, where the value of the strain is greater than that in the low strain region. The Young's modulus in the low strain region is less than the Young's modulus in the high strain region.

6 Claims, 3 Drawing Sheets

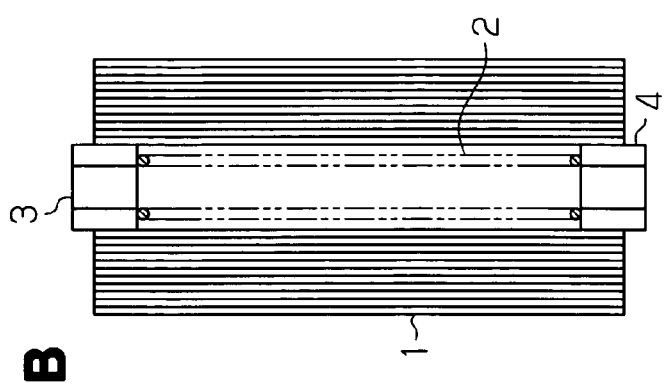
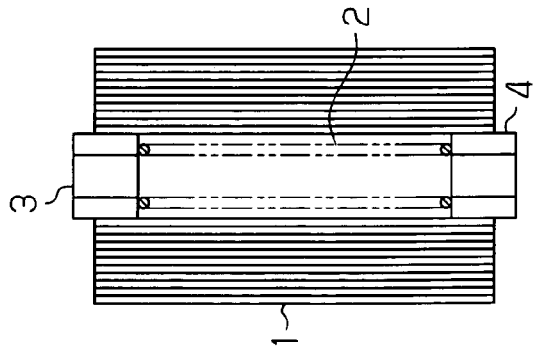
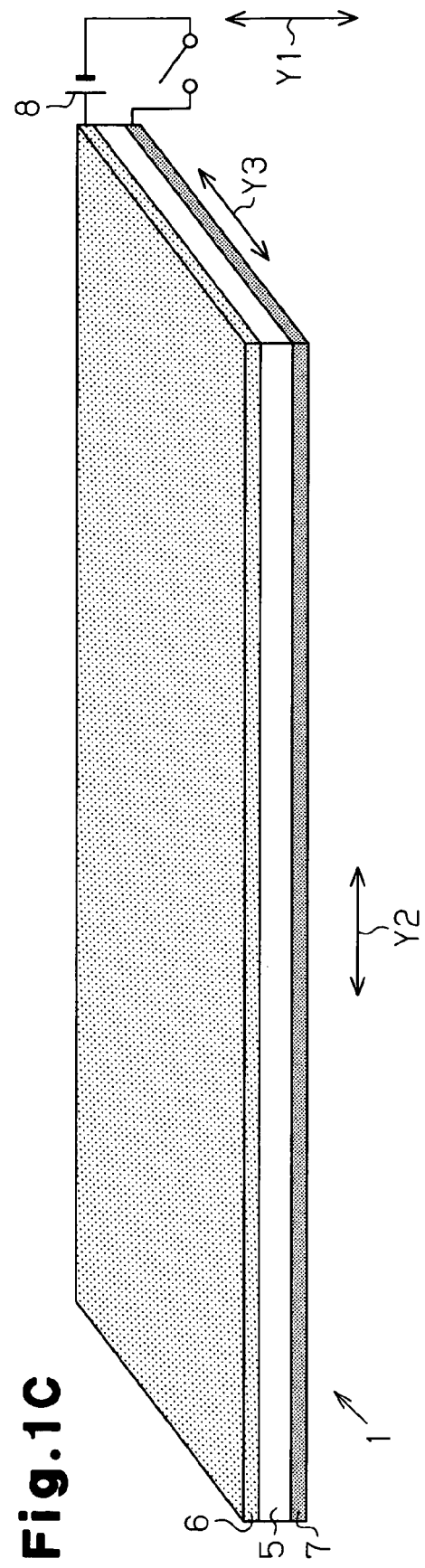

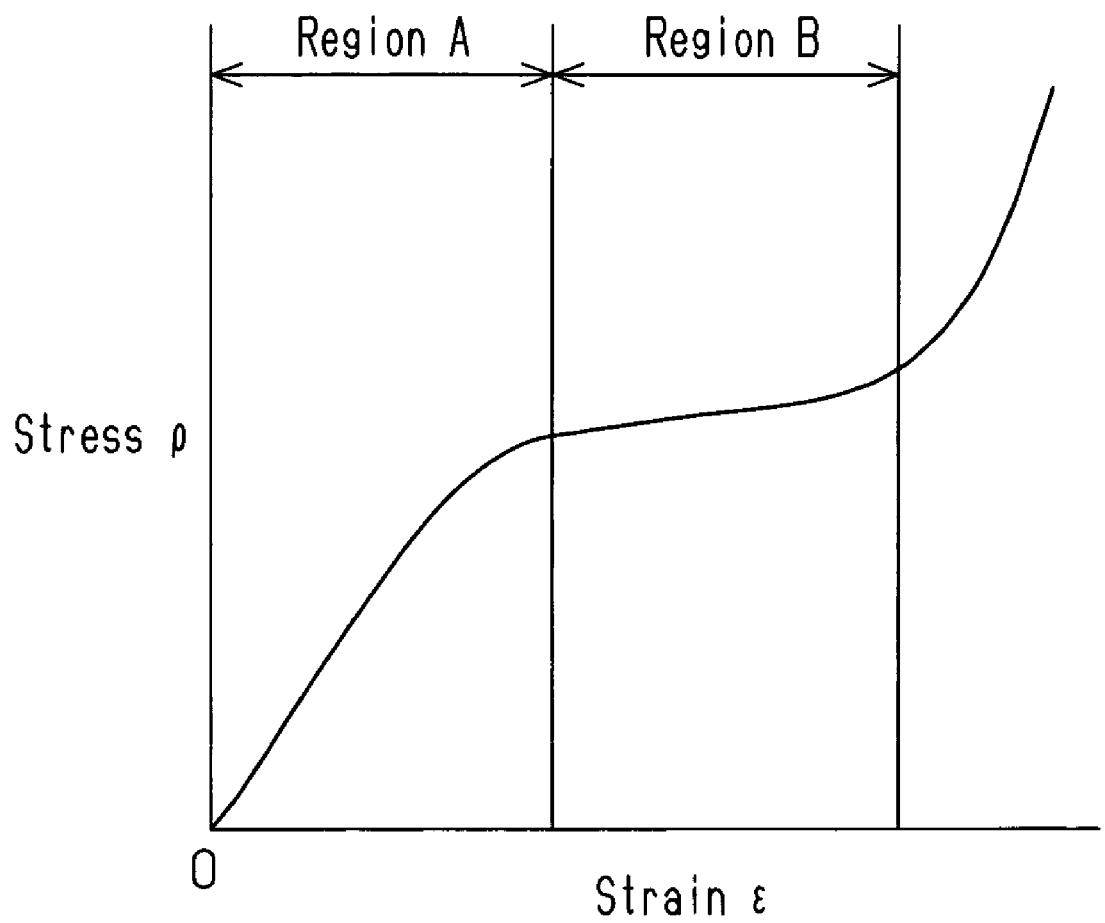

ELASTOMER ACTUATOR

BACKGROUND OF THE INVENTION

The present invention relates to an actuator.

For example, Japanese National Phase Laid-Open Patent Publication No. 2001-524278 discloses an actuator having a layer of an elastic dielectric elastomer with an electrode on each side. When a voltage is applied or the applied voltage is stopped, the dielectric elastomer layer is expanded or shrunk, so that the actuator is actuated. The dielectric elastomer layer of this type of actuator is formed of a high polymer compound such as general-purpose rubber. When a voltage is applied to the electrodes, the dielectric elastomer layer is contracted along the direction of its thickness, and expanded in directions perpendicular to its thickness. When the applied voltage is stopped, the contraction and expansion of the elastomer are cancelled.

FIG. 4 is a graph showing the relationship between the stress generated in the dielectric elastomer layer when a voltage is applied to the electrodes and the strain (expansion and contraction) caused by the stress. As shown in FIG. 4, in region A, where the strain is close to zero, the Young's modulus E, which is obtained by dividing the stress $\rho$ by the strain $\in$, is great, and the increasing rate of the strain $\in$ relative to increase in the stress $\rho$ is small. In region B, where the stress $\in$ is greater than a predetermined value, the Yong's modulus E is small, and the increasing rate of the strain $\in$ relative to increase in the stress $\rho$ is great.

To increase the actuation amount to a required level, it is important to increase the expansion and contraction due to application and cancellation of a voltage to the electrodes. In other words, when the stress $\rho$ generated in the dielectric elastomer layer is changed by starting or stopping voltage application to the electrodes, the strain $\in$ of the dielectric elastomer layer due to the change in the stress $\rho$, needs to change within region B shown in FIG. 4.

Accordingly, a preliminary straining process is performed in the above described actuator to generate a strain $\in$ in a region near the lowest value of the region B in the dielectric elastomer layer when no voltage is applied to the electrodes. Specifically, the dielectric elastomer layer is stretched in directions perpendicular to the direction of the thickness to generate the strain $\in$. In this state, the electrodes are fixed to both sides of the dielectric elastomer layer. The dielectric elastomer layer is therefore stretched by an amount corresponding to the strain $\in$ in a normal state (in a state where no voltage is applied to the electrodes). In other words, a stress $\rho$ that generates the strain $\in$ is applied to the dielectric elastomer layer in the normal state.

The preliminary straining process allows the strain $\in$ of the dielectric elastomer layer, which is caused by a change in the stress $\rho$, to change within region B when the stress $\rho$ generated in the dielectric elastomer layer is changed by starting or stopping voltage application to the electrodes. This increases the actuation amount of the actuator.

However, although the actuation amount of the actuator is increased through the preliminary straining process, the preliminary straining process is troublesome.

SUMMARY OF THE INVENTION

Accordingly, it is an objective of the present invention to provide an actuator that ensures a great actuation amount without performing preliminary straining process.

To achieve the foregoing objective and in accordance with one aspect of the present invention, an actuator having an elastic dielectric elastomer layer is provided. An electrode is provided on each of the sides of the dielectric elastomer layer. The actuator is actuated by applying a voltage to the electrode and stopping the voltage application, so that the dielectric elastomer layer is expanded and contracted. A material forming the dielectric elastomer layer has a low strain region, where the value of a strain based on a stress acting on the dielectric elastomer layer varies from zero to a value that is greater than and close to zero, and a high strain region, where the value of the strain is greater than that in the low strain region. The Young's modulus in the low strain region is less than the Young's modulus in the high strain region.

BRIEF DESCRIPTION OF THE DRAWINGS

FIG. 1A is a diagram showing a normal state of an actuator;

FIG. 1B is a diagram showing the actuator when it is stretched from the normal state;

FIG. 1C is a diagram showing the structure of a sheet body forming the actuator;

FIG. 4 is a graph showing the relationship between the stress $\rho$ generated in the material forming a dielectric elastomer layer and the strain $\in$ caused by the stress $\rho$.

DETAILED DESCRIPTION OF THE PREFERRED EMBODIMENTS

Figure 2:
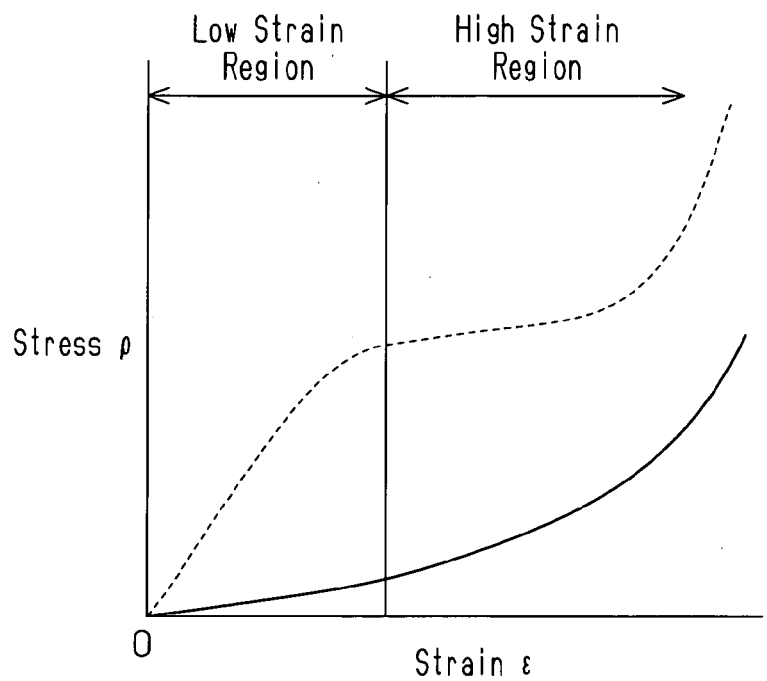
FIG. 2 is a graph showing the relationship between the stress $\rho$ generated in the material forming a dielectric elastomer layer and the strain $\in$ caused by the stress $\beta$.

One embodiment of the present invention will now be described with reference to FIGS. 1 and 2.

An actuator shown in FIG. 1A is a cylindrical body formed by rolling a sheet body 1 shown in FIG. 1C in a spiral manner. The actuator is actuated by expanding and contracting the sheet body 1 relative to the axis, so that its length is changed along the axis.

As shown in FIG. 1A, a coil spring 2 is located in the cylindrical sheet body 1. Nuts 3 and 4 are fixed to the inner circumferential surface of the ends of the sheet body 1. The coil spring 2 urges the nuts 3, 4 away from each other. Thus, the actuator is urged to extend in the axial direction of the actuator (vertical direction as viewed in FIG. 1A) by the elastic force of the coil spring 2. This structure is designed to minimize expansion of the actuator in directions perpendicular to the axial direction when the actuator is operated to extend in the axial direction. Also, the structure is used to maximize the amount of deformation (actuation amount) of the actuator in the axial direction.

As shown in FIG. 1C, the sheet body 1 is formed by attaching sheet-like flexible electrodes 6, 7 to both sides of an elastic dielectric elastomer layer 5. The electrode 6 of the electrodes 6, 7 is connected to a positive terminal of a power source 8, and the electrode 7 is connected to the negative terminal of the power source 8. When a voltage is applied to the electrodes 6, 7, the dielectric elastomer layer 5 is contracted in the thickness direction (direction indicated by arrow Y1 in FIG. 1C), and is expanded in directions perpendicular to the thickness direction, or in directions indicated by arrows Y2 and Y3. When the voltage application to the electrodes 6, 7 is stopped, the elastic force of the dielectric elastomer layer 5 cancels the contraction of the dielectric elastomer layer 5 in the thickness direction and the expansion in directions perpendicular to the thickness direction.

As shown in FIGS. 1A and 1B, the cylindrical sheet body 1 is expanded and contracted when voltage application to the electrode 6, 7 is started or stopped, so that the cylindrical sheet body 1 is extended and contracted along its axis. That is, when the application of voltage to the electrode 6, 7 is started, the cylindrical sheet body 1 extends along its axis. On the other hand, when the voltage application to the electrodes 6, 7 is cancelled, the cylindrical sheet body 1 is contracted along the axis, and is changed from a state represented in FIG. 1B to a state represented in FIG. 1A. In this manner, when the actuator is actuated by using expansion and contraction of the cylindrical the sheet body 1, the actuator is deformed along the axis.

The material forming the dielectric elastomer layer 5 has a property represented by solid line in FIG. 2. Specifically, when a voltage is applied to the electrodes 6, 7, stress $\rho$ is generated in the dielectric elastomer layer 5, and strain (expansion and contraction) $\in$ is generated in the dielectric elastomer layer 5 due to the stress β. The stress $\rho$ and strain $\in$ satisfy the relationship represented by the solid line in FIG. 2. Broken line in FIG. 2 represents the relationship between the stress $\rho$ and the strain $\in$ in a conventional dielectric elastomer layer made of a high polymer component such as a general-purpose rubber. The relationship shown by broken line of FIG. 2 is identical to that shown by solid line in FIG. 4.

As shown by the solid line in FIG. 2, when the stress $\rho$ is generated in the material of the dielectric elastomer layer 5, the Young's modulus E (E=$\rho$/$\in$) in a low strain region is less than that in a high strain region. The low strain region is a region where the value of the strain $\in$ varies from zero to a value that is greater than and close to zero, and the high strain region is a region where the value of the strain $\in$ is greater than that in the low strain region. In this case, the Young's modulus E in the low strain region is substantially the same as the Young's modulus E in region B of a conventional material (for example, general-purpose rubber) represented in FIG. 4, and specifically greater than zero and less than 0.5 MPa. That is, a material used for the dielectric elastomer layer 5 has a Young's modulus E shown by the solid line shown in FIG. 2 in the low strain region. The material of the dielectric elastomer layer 5 is a high polymer composition with movable cross-linking points (for example, high polymer gel). The examples of the material include polyrotaxane. Polyrotaxane is a compound in which a straight-chain molecule is threaded through the openings of cyclic molecules and blocking groups are provided at ends of the pseudo-polyrotaxane, or an inclusion compound, so that the cyclic molecules do not become free. α-cyclodextrin is used as the cyclic molecule, and polyethylene glycol is used as the straight-chain molecule.

The above described embodiment has the following advantages (1) The dielectric elastomer layer 5 is made of a material that has the relationship between the stress $\rho$ and the strain $\in$ due to the stress $\rho$ as represented by the solid line in FIG. 2. Accordingly, the actuation amount of the actuator is increased simply by attaching the electrodes 6, 7 to both sides of the dielectric elastomer layer 5 in the normal state when no strain is generated. That is, the strain of the dielectric elastomer layer 5 caused by starting and stopping of voltage application to the electrode 6, 7 is increased. This, in turn, increases the actuation amount of the actuator, which is actuated by expansion and contraction of the dielectric elastomer layer 5. This eliminates the necessity of the preliminary straining process, in which the electrodes 6, 7 are attached to the dielectric elastomer layer 5 while the layer 5 is stretched and strained in order to increase the actuation amount of the actuator.

(2) A high polymer compound with movable cross-linking points, more specifically, polyrotaxane, is used as the material of the dielectric elastomer layer 5. The Young's modulus E of this material in the low strain region is less than that in the high strain region. In other words, when the stress $\rho$ is applied to the material, the rate of change of the strain $\in$ in relation to a change in the stress $\rho$ is greater in the low strain region than in the high strain region. Therefore, the advantage (1) is reliably obtained.

(3) The actuator is urged to extend along the axis of the actuator by the elastic force of the coil spring 2, which is arranged in the cylindrical sheet body 1. Therefore, when extending the actuator along its axis by applying a voltage to the electrodes 6, 7, the actuator is prevented from expanding in directions perpendicular to the axis of the actuator. As a result, the deformation of the actuator is limited to the one along the axis. This increases the amount of deformation (actuation amount) of the actuator along the axis when voltage application to the electrodes 6, 7 is started and stopped.

The above described embodiments may be modified as follows.

Figure 3:
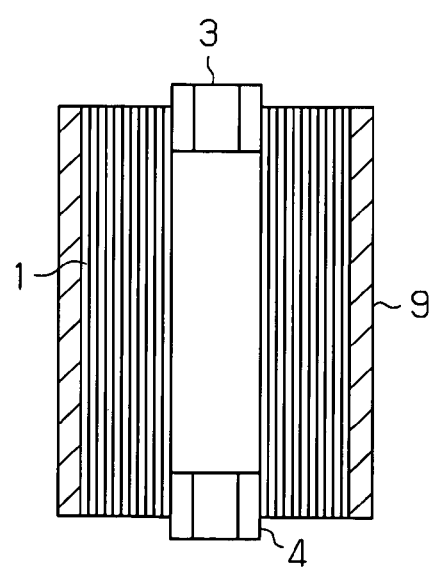
FIG. 3 is a diagram showing a modification of an actuator.

As shown in FIG. 3, a cylindrical cover 9 may be provided about the outer circumferential surface of the cylindrical sheet body 1, thereby preventing the actuator from expanding in directions perpendicular to the axis. In this case, the advantage equivalent to the above described advantage (3) is obtained without providing the coil spring 2 (FIG. 1A) in the cylindrical sheet body 1.

In the illustrated embodiment, a material of which the Young's modulus E in the low strain region shown in FIG. 2 is greater than zero and less than 0.5 MPa is used as the material of the dielectric elastomer layer 5. However, the value of the Young's modulus is not limited to this.

The dielectric elastomer layer 5 may be formed of a high polymer component with movable cross-linking points other than polyrotaxane.

The dielectric elastomer layer 5 may be formed of a material other than high polymer components with movable cross-linking points, as long as the material has a property represented by the solid line in FIG. 2.

The invention claimed is:

1. An elastomer actuator having a sheet body, comprising:
   an elastic dielectric elastomer layer; and
   electrodes provided on the sides of the dielectric elastomer layer without performing a preliminary straining process, the elastomer actuator being a cylindrical body formed by rolling the sheet body in a spiral manner, wherein the elastomer actuator is actuated by applying a voltage to the electrode and stopping the voltage application, so that the dielectric elastomer layer is expanded and contracted,
   wherein a material forming the elastic dielectric elastomer layer has:
      a low strain region, where the value of a strain based on a stress acting on the dielectric elastomer layer varies from zero to a value that is greater than and close to zero; and
      a high strain region, where the value of the strain is greater than that in the low strain region,
   wherein the Young's modulus in the low strain region is less than the Young's modulus in the high strain region, and
   wherein a coil spring is located in the cylindrical sheet body.

2. The elastomer actuator according to claim 1, wherein the material forming the dielectric elastomer layer is a high polymer composition with movable cross-linking points.

3. The elastomer actuator according to claim 2, wherein the high polymer composition with movable cross-linking points is polyrotaxane.

4. An elastomer actuator, formed as a cylinder, comprising:
a spirally rolled sheet body including
   an elastic dielectric elastomer layer and
   an electrode provided on each side of the dielectric elastomer layer without performing a preliminary straining process; and
a coil spring disposed axially inside the cylinder, wherein
   when a voltage is applied to each electrode, a stress acts on the dielectric elastomer layer,
   a material forming the elastic dielectric elastomer layer has a low strain region, where the value of a strain, based on the stress acting on the dielectric elastomer layer, varies from zero to a value that is greater than and close to zero,
   the material forming the elastic dielectric elastomer layer has a high strain region, where the value of the strain, based on the stress acting on the dielectric elastomer layer, is greater than that in the low strain region, and
   the Young's modulus in the low strain region is less than the Young's modulus in the high strain region.

5. The elastomer actuator according to claim 4, wherein the material forming the dielectric elastomer layer is a high polymer composition with movable cross-linking points.

6. The elastomer actuator according to claim 5, wherein the high polymer composition with movable cross-linking points is polyrotaxane.

* * * * *

UNITED STATES PATENT AND TRADEMARK OFFICE
CERTIFICATE OF CORRECTION

PATENT NO. : 7,915,792 B2
APPLICATION NO. : 12/292155
DATED : March 29, 2011
INVENTOR(S) : Takeuchi et al.

It is certified that error appears in the above-identified patent and that said Letters Patent is hereby corrected as shown below:

Title page, item 73

Assignees: should read -- TOYODA GOSEI CO., LTD., Aichi-pref., Japan, and
ADVANCED SOFTMATERIALS INC., Tokyo, Japan --

Signed and Sealed this
Fourteenth Day of June, 2011

David J. Kappos
*Director of the United States Patent and Trademark Office*